(12) United States Patent
Hyun

(10) Patent No.: US 11,109,484 B2
(45) Date of Patent: Aug. 31, 2021

(54) SMART KEY FOR VEHICLE

(71) Applicant: Continental Automotive GmbH, Hannover (DE)

(72) Inventor: YoungJin Hyun, Gyeonggi-do (KR)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/800,033

(22) Filed: Feb. 25, 2020

(65) Prior Publication Data

US 2020/0296835 A1  Sep. 17, 2020

(30) Foreign Application Priority Data

Mar. 15, 2019  (KR) .................. 10-2019-0029649

(51) Int. Cl.
| | |
|---|---|
| *H05K 5/00* | (2006.01) |
| *H05K 1/18* | (2006.01) |
| *B60R 25/24* | (2013.01) |
| *H02S 30/00* | (2014.01) |
| *H05K 5/03* | (2006.01) |
| *H05K 7/14* | (2006.01) |

(52) U.S. Cl.
CPC .............. *H05K 1/181* (2013.01); *B60R 25/24* (2013.01); *H02S 30/00* (2013.01); *H05K 5/03* (2013.01); *H05K 7/1427* (2013.01); *H05K 2201/10143* (2013.01)

(58) Field of Classification Search
USPC ......................................................... 361/752
See application file for complete search history.

(56) References Cited

U.S. PATENT DOCUMENTS

| | | | | |
|---|---|---|---|---|
| 6,433,728 | B1 * | 8/2002 | Krupp ................ | G07C 9/00944 341/173 |
| 7,872,442 | B2 * | 1/2011 | Liang .................... | H02J 7/0044 320/101 |
| 8,976,535 | B2 * | 3/2015 | Paek ........................ | H05K 7/02 361/748 |
| 9,642,089 | B2 * | 5/2017 | Sharma ................ | H04B 5/0062 |
| 2016/0371907 | A1 | 12/2016 | Ma et al. | |
| 2017/0345264 | A1 * | 11/2017 | Matsumura ............. | H04W 4/80 |

FOREIGN PATENT DOCUMENTS

| | | |
|---|---|---|
| CN | 105257098 A | 1/2016 |
| CN | 205591668 U | 9/2016 |
| CN | 108442818 A | 8/2018 |
| JP | 2013044171 A | 3/2013 |

(Continued)

OTHER PUBLICATIONS

Chinese Office Action for Chinese Application No. 202010169073. 9, dated Feb. 1, 2021 with translation, 12 pages.

*Primary Examiner* — Hung S. Bui
(74) *Attorney, Agent, or Firm* — RatnerPrestia

(57) ABSTRACT

A smart key for a vehicle, including: a case part; a substrate part which is coupled to the case part and on which electronic components are mounted; a plate part which supports the substrate part; a solar power unit which is supported on the plate part and supplies power to the substrate part by means of sunlight; and a sheet part which is coupled to the case part and which covers the solar power unit, so as to be able to operate the vehicle, by way of sunlight, without replacing the battery.

4 Claims, 5 Drawing Sheets

(56) References Cited

FOREIGN PATENT DOCUMENTS

| | | |
|---|---|---|
| JP | 2013050010 A | 3/2013 |
| JP | 2013245466 A | 12/2013 |
| JP | 2016111387 A | 6/2016 |
| KR | 20090050743 A | 5/2009 |
| KR | 100980974 B1 | 9/2010 |
| KR | 20120003037 A | 1/2012 |
| KR | 20140028170 A | 3/2014 |
| KR | 20160096910 A | 8/2016 |
| KR | 20180041789 A | 4/2018 |

* cited by examiner

SMART KEY FOR VEHICLE

CROSS REFERENCE TO RELATED APPLICATIONS

This application claims priority to Korean Patent Application No. 10-2019-0029649, filed Mar. 15, 2019, the contents of such application being incorporated by reference herein.

FIELD OF THE INVENTION

The present invention relates to a smart key for a vehicle, and more specifically relates to a smart key for a vehicle, wherein thickness increase is restricted and battery replacement can be omitted by using sunlight.

BACKGROUND OF THE INVENTION

In general, keys for vehicles for putting a door of the vehicle into a locked or an unlocked state and for starting the vehicle include typical rod-shaped keys and folding keys in which the key blade is folded into the inside of a key main body.

In addition, recently, smart keys are mainly used, which are operated by a radio frequency identification (RFID) method from a long distance, rather than a method in which the operator or user locks or unlocks the door by directly coupling the key blade for the vehicle to the keyhole in the door.

However, there is a problem in that conventional smart keys have had to be designed such that, in use, batteries can be replaced, and thus had to be designed to satisfy the relevant regulations, and mechanical malfunctions due to the introduction of foreign materials are caused as waterproof and dustproof designs are challenging. Therefore, there is need for improvement.

The background art of the present invention is described in Korean Laid-Open Patent Publication No. 2012-0003037 (Laid-Open Jan. 10, 2012, and titled SMART KEY FOR VEHICLE), which is incorporated by reference herein.

SUMMARY OF THE INVENTION

An aspect of the present invention was devised in order to improve upon problems such as the above, and the objective of the present invention is to provide a smart key for a vehicle wherein thickness increase is restricted and battery replacement can be omitted by using sunlight.

A smart key for a vehicle according to one aspect of the present invention is characterized in that the smart key comprises: a case part; a substrate part which is coupled to the case part and on which electronic components are mounted; a plate part which supports the substrate part; a solar power unit which is supported on the plate part and supplies power to the substrate part by means of sunlight; and a sheet part which is coupled to the case part and which covers the solar power unit.

The case part is characterized in that the case part comprises: a case circumference part into which the edges of the substrate part are inserted; a case cover part which is attached to the case circumference part and covers a portion of the substrate part; and an exposing case part which is formed in the case cover part and exposes the substrate part and the plate part to the outside.

The plate part is characterized in that the plate part comprises: a first plate part which supports the solar power unit; a second plate part which extends from the first plate part and supports the substrate part; and one or more third plate parts which extend from the first plate part and the second plate part and are coupled to the substrate part.

The solar power unit is characterized in that the solar power unit comprises: a power supply unit which is seated on the plate part and supplies power by means of sunlight; a power source adhesion part which is disposed between the power supply unit and the plate part and adheres the power supply unit to the plate part; and a power link part which is formed on the power supply unit and is connected to the substrate part so as to supply power thereto.

The sheet part is characterized in that the sheet part comprises: a sheet cover part which is adhered to the case part and covers the solar power unit; and a transmissive sheet part which is formed on the sheet cover part and through which sunlight is transmitted to the solar power unit.

In the smart key for a vehicle according to an aspect of the present invention, the solar power unit is stably supported on the plate part to prevent damage from external impacts, and the solar power unit is connected to the substrate part so as to allow a power supply by means of sunlight thereby making it possible for a battery replacement operation to be omitted.

DETAILED DESCRIPTION OF THE PREFERRED EMBODIMENTS

Figure 1:
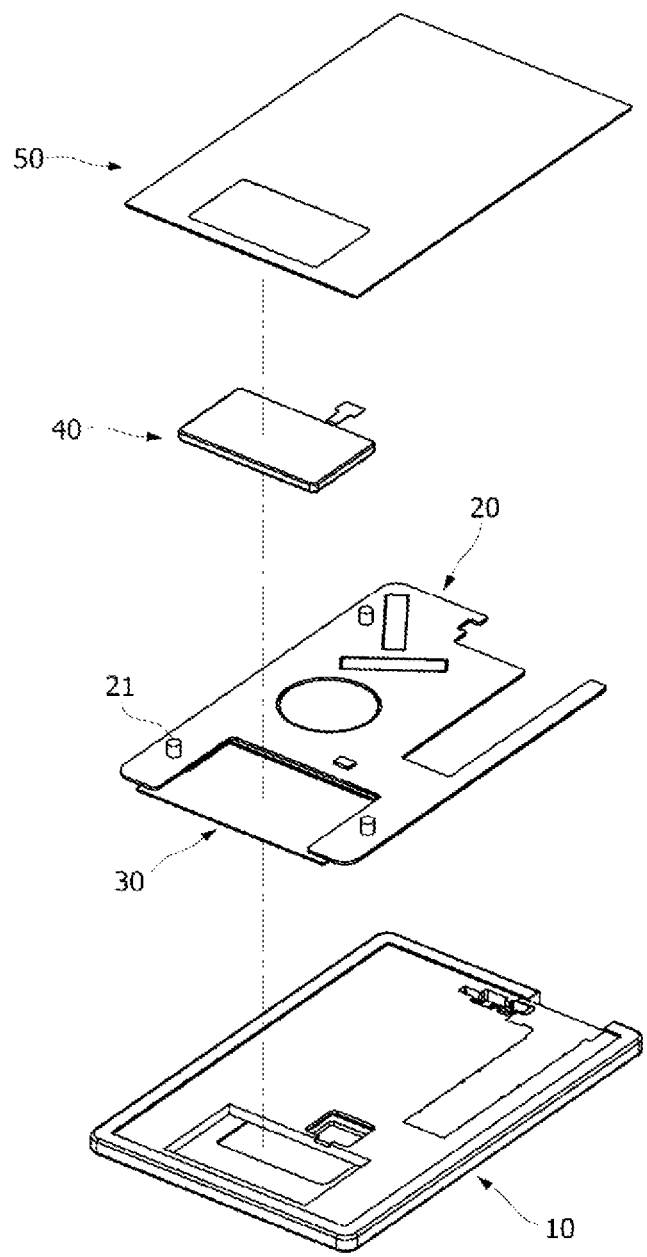
FIG. 1 is a drawing schematically showing a smart key for a vehicle according to an embodiment of the present invention.

Hereinafter, an embodiment of a smart key for a vehicle according to an aspect of the present invention will be described with reference to the accompanying drawings. In this process, aspects such as the thickness of lines or the size of the components shown in the drawings may be exaggerated for clarity and ease of understanding of the description. In addition, the following terms are defined in regard of the functions of an aspect of the present invention, which may vary depending on the intention or practices of the user or operator. Therefore, the definitions of these terms should be based on the content throughout the whole of this specification.

FIG. 1 is a drawing schematically showing the smart key for a vehicle according to an embodiment of the present invention. Referring to FIG. 1, a smart key (1) for a vehicle according to an embodiment of the present invention comprises: a case part (10); a substrate part (20); a plate part (30); a solar power unit (40); and a sheet part (50).

The case part (10) partially covers the substrate part (20), and the substrate part (20) has electronic components for vehicle remote control mounted on one side or both sides thereof and is coupled to the case part (10). Such a substrate part (20) has a circuit formed thereon so as to guide the electronic signals of the electronic components. For example, electronic components such as one or more electronic element(s) and antenna(s) are installed on the substrate part (20), and can maintain a coupled state with the case part (10).

The plate part (30) supports the substrate part (20) and maintains its rigidity. In addition, the solar power unit (40) is supported on the plate part (30) and supplies power to the substrate part (20) by means of sunlight.

Meanwhile, the sheet part (50) is coupled to the case part (10) and covers the solar power unit (40). Such a sheet part (50) can form the exterior of the smart key (1) for a vehicle while protecting the solar power unit (40). Furthermore, the sheet part (50) can be formed such that sunlight is transmitted therethrough, thereby enabling power to be supplied from the solar power unit (40).

Figure 2:
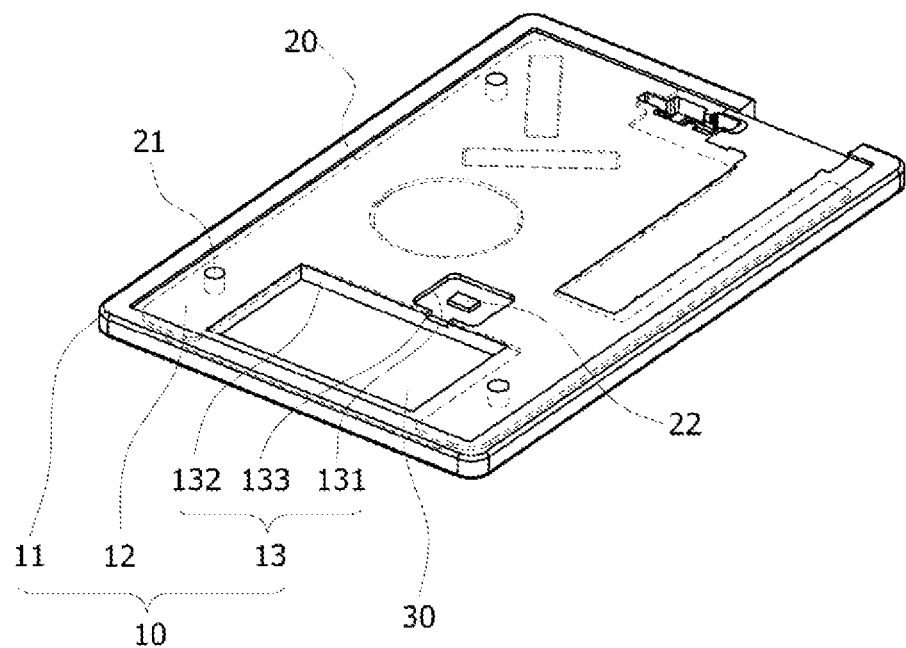
FIG. 2 is a drawing schematically showing a case part according to an embodiment of the present invention.
Figure 3:
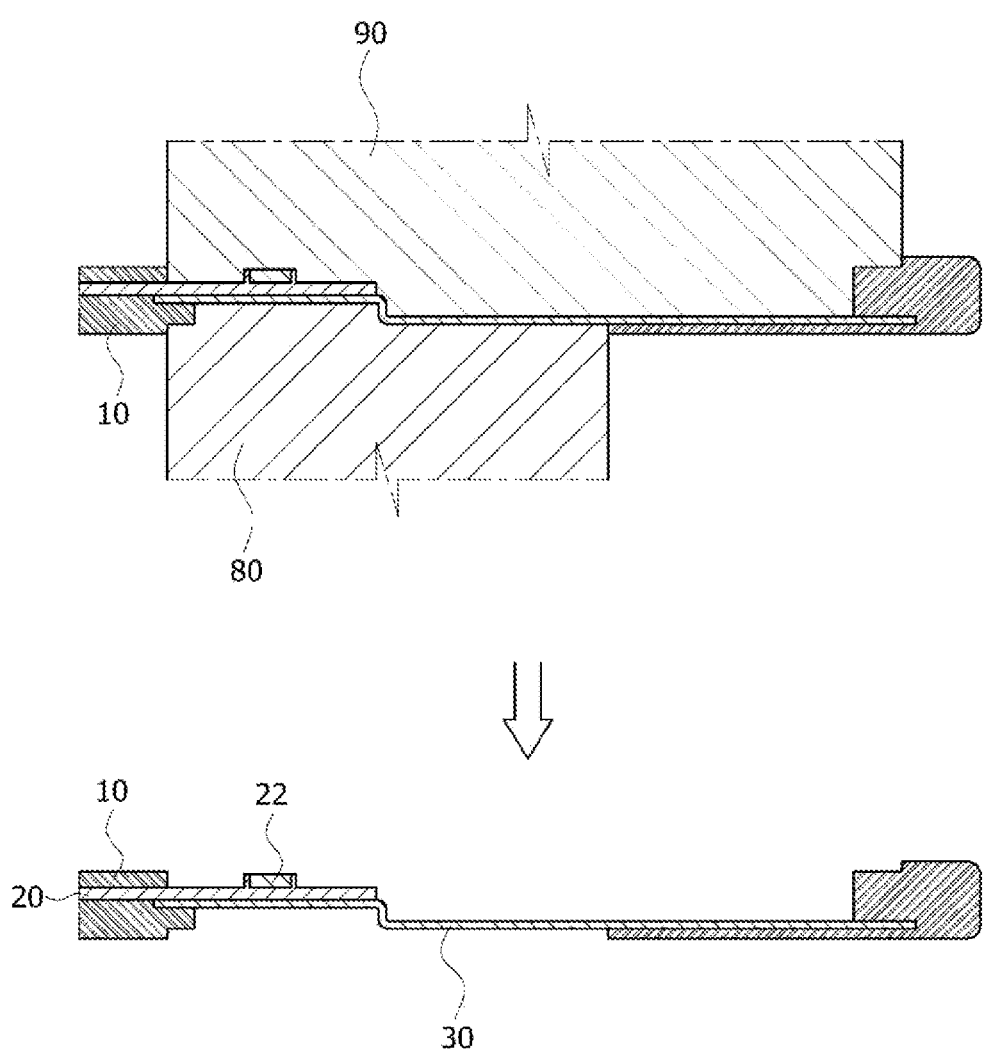
FIG. 3 is a drawing schematically showing a die for molding the case part according to an embodiment of the present invention.

FIG. 2 is a drawing schematically showing the case part according to an embodiment of the present invention, and FIG. 3 is a drawing schematically showing the die for molding the case part according to an embodiment of the present invention. Referring to FIGS. 1 to 3, the case part (10) according to an embodiment of the present invention comprises a case circumference part (11), a case cover part (12), and an exposing case part (13). By way of example, the case part (10) can be molded after a resin-based liquid has cured around the substrate part (20).

The case circumference part (11) forms the border of the smart key (1) for a vehicle and the edges of the substrate part (20) are inserted therein. By way of example, when the substrate part (20) coupled to the plate part (30) is seated between an upper die and a lower die, the edges of the substrate part (20) can be insert molded in the case circumference part (11) while a liquid molding material is curing after being injected.

The case cover part (12) is attached to the case circumference part (11) and covers a portion of the substrate part (20). By way of example, the case cover part (12) can be molded integrally with the case circumference part (11) and extend to the inside of the case circumference part (11). The case cover part (12) covers a side surface of the substrate part (20) on which there are no electronic components, and a substrate protrusion part (21) formed on the side surface of the substrate part (20) can be insert molded therein to improve the coupling force.

The exposing case part (13) is formed in the case cover part (12) and exposes the substrate part (20) and the plate part (30). By way of example, the exposing case part (13) may comprise: a first exposing part (131) which exposes a connection terminal part (22) of the substrate part (20); a second exposing part (132) which exposes the plate part (30); and a third exposing part (133) which links the first exposing part (131) and the second exposing part (132).

Meanwhile, when an upper support part (90) of the upper die is in close contact with the upper surfaces of the substrate part (20) and the plate part (30), the exposing case part (13) can be formed while the liquid molding material is curing after being injected.

Figure 4:
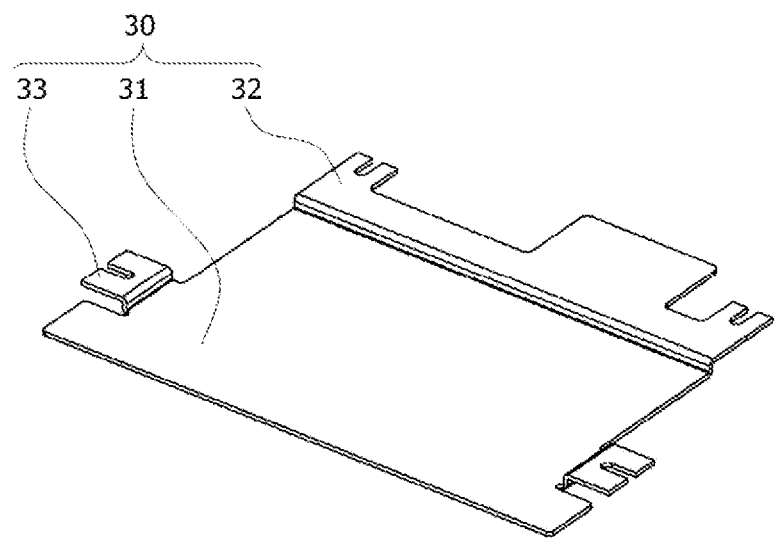
FIG. 4 is a drawing schematically showing a plate part according to an embodiment of the present invention.

FIG. 4 is a drawing schematically showing the plate part according to an embodiment of the present invention. Referring to FIG. 3 and FIG. 4, the plate part (30) according to an embodiment of the present invention comprises: a first plate part (31); a second plate part (32); and a third plate part (33).

The first plate part (31) supports the solar power unit (40) and the second plate part (32) extends from the first plate part (31) and supports the substrate part (20). One or more third plate parts (33) extend from the first plate part (31) and the second plate part (32) and couple with the substrate part (20).

By way of example, the second plate part (32) which is bent and extends from the first plate part (31) is disposed horizontally to the first plate part (31) and has a different height to the first plate part (31) so as to be able to stably support the substrate part (20) on which the connection terminal part (22) is formed. In addition, the third plate parts (33) can be molded to the substrate part (20) so as to maintain a coupled state therewith.

Meanwhile, a lower support part (80) of the lower die supports the bottom surface of the plate part (30) and is disposed so as to face the upper support part (90) of the upper die in order to be able to stably support the molded substrate part (20) and plate part (30).

Figure 5:
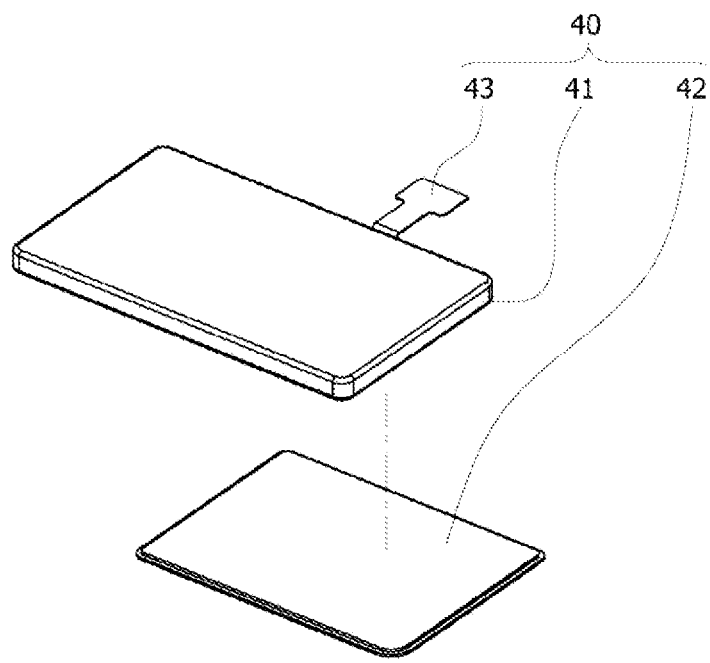
FIG. 5 is a drawing schematically showing a solar power unit according to an embodiment of the present invention.

FIG. 5 is a drawing schematically showing the solar power unit according to an embodiment of the present invention. Referring to FIG. 5, the solar power unit (40) according to an embodiment of the present invention comprises: a power supply unit (41); a power source adhesion part (42); and a power link part (43).

The power supply unit (41) is seated on the plate part (30) and supplies power by means of sunlight. As an example, the power supply unit (41) can be inserted into the second exposing part (132) so as to be seated in the exposed plate part (30), and generate electrical power when sunlight is irradiated thereon, and store the generated electrical power.

The power source adhesion part (42) is disposed between the power supply unit (41) and the plate part (30) and adheres the power supply unit (41) to the plate part (30). As an example, the power source adhesion part (42) may be double-sided tape, and can secure the power supply unit (41) to the plate part (30).

The power link part (43) is formed on the power supply unit (41) and is connected to the substrate part (20) to supply power thereto. As an example, one end of the power link part (43) can be attached to the power supply unit (41) and the other end can be attached to the connection terminal part (22). The power link part (43) can pass through the third exposing part (133).

Figure 6:
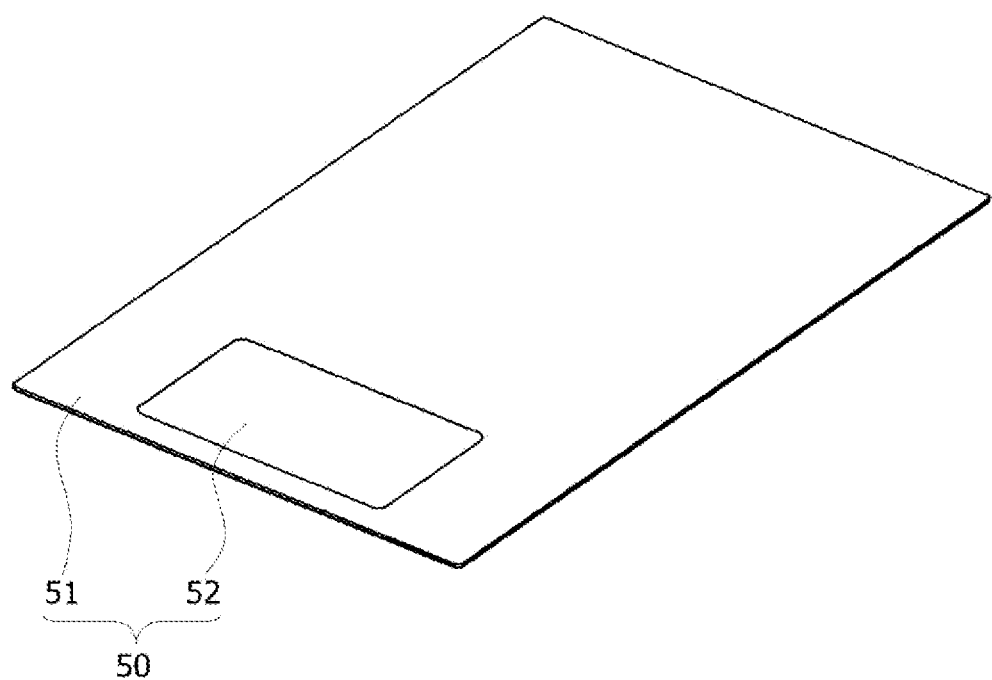
FIG. 6 is a drawing schematically showing a sheet part according to an embodiment of the present invention.

FIG. 6 is a drawing schematically showing the sheet part according to an embodiment of the present invention. Referring to FIG. 6, the sheet part (50) according to an embodiment of the present invention comprises a sheet cover part (51) and a transmissive sheet part (52).

The sheet cover part (51) is adhered to the case part (10) and covers the solar power unit (40). As an example, an adhesive can be formed on the edges of the sheet cover part (51) so as to adhere to the case circumference part (11). Outside of that, the sheet cover part (51) can cover a space formed by means of the lower support part (80).

The transmissive sheet part (52) is formed in the sheet cover part (51) and transmits sunlight to the solar power unit (40). As an example, the transmissive sheet part (52) can be formed in the sheet cover part (51) wherein the transmissive sheet part is disposed in alignment with the power supply unit (41).

Meanwhile, the sheet cover part (51) and transmissive sheet part (52) are integrally formed, and the sheet cover part (51) and the transmissive sheet part (52) can be differentiated through a printing process for selective application of light transmission.

There now follows a description of the manufacture and operation of a smart key for a vehicle according to an embodiment of the present invention having the above-described configuration.

The plate part (30) is coupled to the substrate part (20), and the substrate part (20), to which the plate part (30) has been coupled, is inserted into the upper die and lower die. In this case, the lower support part (80) supports the bottom surface of the plate part (30) and the upper support part (90) supports the upper surfaces of the substrate part (20) and plate part (30).

In the above state, when a molding liquid is cured after being injected between the upper die and lower die, the edges of the substrate part (20) are insert molded in the case part (10). In this case, the connection terminal part (22) of the substrate part (20) and a portion of the first plate part (31) of the plate part (30) are exposed by means of the upper support part (90).

The first plate part (31), which has been exposed to the outside, is coupled to the power supply unit (41) via the power source adhesion part (42), and maintains a state in which the power link part (43) coupled to the power supply unit (41) is connected to the connection terminal part (22) and electrically linked thereto.

When the solar power unit (40) and substrate part (20) are electrically linked, the sheet part (50) is bonded to the case part (10) and a finishing process is carried out.

When the manufacture of the smart key (1) for a vehicle is completed, sunlight reaches the power supply unit (41) through the transmissive sheet part (52) formed in the sheet part (50), and the power supply unit (41) generates power by means of sunlight and stores same. In addition, the power stored in the power supply unit (41) is supplied to the substrate part (20) through the power link part (43).

Accordingly, the smart key (1) for a vehicle can be continuously used even without carrying out a separate battery replacement.

In the smart key for a vehicle according to an embodiment of the present invention, the solar power unit (40) is stably supported on the plate part (30) to prevent damage from external impacts, and the solar power unit (40) is connected to the substrate part (20), thereby allowing a power supply by means of sunlight and thus making it possible to omit a battery replacement operation.

Although an aspect of the present invention has been described with reference to the embodiments illustrated in the drawings, this is merely illustrative. It will be understood by those skilled in the art to which the present technology belongs that it is possible to implement various modifications and other equivalent embodiments based thereon. Accordingly, the true scope of technical protection of the present invention should be determined by the following claims.

DESCRIPTION OF THE REFERENCE NUMERALS

| | |
|---|---|
| 10: Case part | 11: Case circumference part |
| 12: Case cover part | 13: Exposing case part |
| 20: Substrate part | 30: Plate part |
| 31: First plate part | 32: Second plate part |
| 33: Third plate part | 40: Solar power unit |
| 41: Power supply unit | 42: Power source adhesion part |
| 43: Power link part | 50: Sheet part |
| 51: Sheet cover part | 52: Transmissive sheet part |

The invention claimed is:

1. A smart key for a vehicle comprising:
a case part;
a substrate part which is coupled to the case part and on which electronic components are mounted;
a plate part which supports the substrate part;
a solar power unit which is supported on the plate part and supplies power to the substrate part by way of sunlight; and
a sheet part which is coupled to the case part and which covers the solar power unit,
wherein the plate part comprises:
a first plate part which supports the solar power unit;
a second plate part which extends from the first plate part and supports the substrate part; and
one or more third plate parts which extend from the first plate part and the second plate part and are coupled to the substrate part.

2. The smart key for a vehicle of claim 1, wherein the case part comprises:
a case circumference part into which edges of the substrate part are inserted;
a case cover part which is attached to the case circumference part and covers a portion of the substrate part; and
an exposing case part which is formed in the case cover part and exposes the substrate part and the plate part to the outside.

3. The smart key for a vehicle of claim 1, wherein the solar power unit comprises:
a power supply unit which is seated on the plate part and supplies power by way of sunlight;
a power source adhesion part which is disposed between the power supply unit and the plate part and adheres the power supply unit to the plate part; and
a power link part which is formed on the power supply unit and is connected to the substrate part to supply power thereto.

4. The smart key for a vehicle of claim 1, wherein the sheet part comprises:
a sheet cover part which is adhered to the case part and covers the solar power unit; and
a transmissive sheet part which is formed on the sheet cover part and through which sunlight is transmitted to the solar power unit.

* * * * *